United States Patent [19]

Dorfman

[11] Patent Number: 4,986,880

[45] Date of Patent: Jan. 22, 1991

[54] PROCESS FOR ETCHING POLYIMIDE SUBSTRATE IN FORMATION OF UNSUPPORTED ELECTRICALLY CONDUCTIVE LEADS

[75] Inventor: Jay R. Dorfman, Durham, N.C.

[73] Assignee: E. I. Du Pont de Nemours and Company, Wilmington, Del.

[21] Appl. No.: 442,811

[22] Filed: Nov. 29, 1989

[51] Int. Cl.$^5$ .................. B44C 1/22; B29C 37/00; C23F 1/02; C03C 15/00

[52] U.S. Cl. .................................... 156/655; 156/656; 156/659.1; 156/668; 156/902; 252/79.5

[58] Field of Search ............... 252/79.5; 156/640, 644, 156/655, 656, 659.1, 664, 666, 668, 902; 357/70; 29/827; 361/421; 174/52.1, 68.5; 437/182, 183, 217, 220

[56] References Cited

U.S. PATENT DOCUMENTS

| | | | |
|---|---|---|---|
| 4,426,253 | 1/1984 | Kreuz et al. | 156/668 |
| 4,650,545 | 3/1987 | Laakso et al. | 156/655 |
| 4,681,654 | 7/1987 | Clementi et al. | 156/630 |

*Primary Examiner*—William A. Powell

[57] ABSTRACT

Formation of unsupported electrically conductive leads is obtained by etching of a polyimide substrate using an etching solution with a low etch ratio.

10 Claims, No Drawings

PROCESS FOR ETCHING POLYIMIDE SUBSTRATE IN FORMATION OF UNSUPPORTED ELECTRICALLY CONDUCTIVE LEADS

FIELD OF THE INVENTION

This invention relates to the etching of a polyimide substrates in formation of electrically conductive leads with unsupported portions which are particularly useful in fine pitch electronic components.

BACKGROUND OF THE INVENTION

Current trends in the electronics industry are moving toward higher signal, power, and ground line densities, smaller size packages, and increased performance characteristics, such as less crosstalk, lower inductances, and greater resistance to failure from thermal cycling stress. The higher signal line densities in electronic packages may require interconnection leads on less than 0.6 mm centers or pitch. Typically these would be fabricated using fine pitch technology versus surface mount or through hole technologies. One type of fine pitch technology is tape automated bonding (TAB). TAB uses photoimaging and etching processes to produce conductors on a dielectric/conductor tape which looks similar to movie film formats. The most visible aspect of a TAB system is the carrier tape, which typically is 8 to 70 mm wide and stored on reels. The tape is formed by an insulating substrate, typically polyimide, which can have a single side or both sides with a thin conductor layer, usually copper. At specific locations in the tape there are windows or cavities through the substrate and conductor layers. A conductor layer contains the signal pattern to give the desired interconnection circuitry with 'beam-type' leads or fingers that extend over the windows in the tape. In subsequent processing, the beams are bonded to an integrated circuit die or chip that is precisely located under the windows. Sprocket holes or features on the tape carrier permits automated tape-handling equipment to accurately position the individual dice for the subsequent processing operations, such as testing, burn-in, and mounting.

There are many advantages to using a tape automated bonding system to mount semi-protected integrated circuit dice to printed boards. Some advantages of TAB are that it provides; a means for pretesting and 'burn-in' of the dice prior to their final mounting, the possibility of automated mass bonding of the leads to dice, improved heat transfer versus wire-bonded attachment due to the copper beam leaded technique, and many more which one skilled in the art would appreciate. Because of the many advantages of tape automated bonding, the manufacturers of components for the electronics industry have considerable incentive to overcome the disadvantages and technical problems in the formation of the TAB carrier tape.

One such problem is the proper formation of the beam-type leads or fingers of the signal layer which extend into windows in the tape. These leads are very fine with typically less than 0.003 in. (0.0762 mm) in width, 0.0014 in. (0.036 mm) in. thickness, and 0.030 in. (0.762 mm) in length. Also once the leads are formed, the substrate no longer supports them from underneath, so that the critical stress point for the leads is located at the periphery of the window where the substrate support ends and the base of the beam-type lead begins. It is desirable at this location to have the peripheral wall of the window as close to perpendicular to the beam-type leads as possible, by minimizing the undercutting of the substrate in the window. The leads must be adequately supported by the substrate at the peripheral wall of the window in order to prevent the fine lead from bending and shorting the die once attached or in the case with 2 conductor layers, shorting with the opposite conductor layer.

It is therefore an object of this invention to provide a method to minimize the undercut of a polyimide substrate at a location where fine pitch beam-type leads are formed and the terminus of such lead extends unsupported into a window cavity.

SUMMARY OF THE INVENTION

The present invention is directed to a process for formation of an electrically conductive lead with an unsupported portion formed by removal through etching of a portion of a polyimide substrate supporting an electrically conductive material comprising the application of an etching solution consisting essentially of about 87 to 89% by weight of ethanol and about 13 to 11% by weight of potassium hydroxide, sodium hydroxide or sodium hydroxide in aqueous solution to a surface of the polyimide substrate other than a substrate surface facing and supporting the electrically conductive material whereby a polyimide layer which supports electrically conductive material is removed.

DETAILED DESCRIPTION OF THE INVENTION

The starting material for the process of the present invention involves an electrically conductive lead supported on a polyimide substrate with the electrically conductive lead forming a portion of a pattern such as present in a printed circuit. A preferred electrically conductive material which forms the lead is copper but other well known materials can be employed including gold or silver.

The present invention in formation of an unsupported lead will be discussed in relationship to a final article of a tape automated bonding carrier tape (TAB) although the present process can be employed where an unsupported electrically conduction portion, i.e., a lead, extends from a polyimide substrate. The fabrication of tape automated bonding carrier tape for interconnection to dies or chips involves a series of repetitive steps in the formation of vias, signal and ground line patterns, and beam-type leads on the or a portion of metal conductor layer as well as for window formation in the substrate.

TAB tape typically require high density interconnection leads with less than 0.6 mm centers or pitch and high resolution techniques of photoimaging and etching are conventionally used on the conductor layers. A suitable starting material in TAB formation involves a flexible polyimide film substrate coated on one or both sides with an electrically conductive layer (such as copper). Photoimaging and etching on the conductor layer or layers typically involves the photographic printing of usually a positive pattern using a temporary protective coating or resist. The background conductor is then etched away by subjecting the substrate to an etching solution, e.g., ferric chloride, ammonium persulfate, and the like resulting in an electrically conductive pattern. The temporary coating resist is removed from the substrate using appropriate solvents, e.g. alkali soluble resists are removed with alkali solvents. Other well known processes can be employed to form an electrically conductive pattern on a polyimide substrate if desired. Small diameter holes or vias can be produced in the substrate by a laser beam, punching, drilling and the like. The exposed holes and lines patterns are coated with a conductor such copper by conventional means as electroless deposition and electroplating. Such material in the case of TAB represents the starting material for the process of the present invention.

In the present invention a window cavity is formed whereby the polyimide film is initially etched from the surface of the film which does not contain the conductive portion which is to form the unsupported terminal conductor. In an alternate embodiment which is less preferred a polyimide substrate could be etched laterally, i.e., perpendicular to the conductive circuitry. Such etching could take place when a thick polyimide substrate is employed without formation of a window. In each instance with the etching step of the present invention, the degree of etching to form a cavity window or cavity is high while the degree of etching at a peripheral wall of the window or wall is relatively low. Thus, a peripheral supporting wall can be substantially perpendicular to a beam-type leads in providing sufficient support for the leads when, e.g., they are attached to a semiconductor or bent, e.g., to provide a connection to another electrically conductive layer. The etching step of a polyimide substrate is undertaken with the requirement of maximizing the degree of etching in a z-direction, i.e., the depth of the substrate, relative to the etching in a x-y direction, i.e., the surface of the substrate. If the above condition is not satisfied, fragile beam-type leads to be formed will not be adequately supported due to the undercutting of the polyimide at the base of the beam-type leads. For example with significant undercutting the beam-type leads can contact one another causing shorting of the two surfaces.

In order to form a supported electrically conductive terminal extending from a supported conductive pattern wherein the support is a polyimide substrate, it is necessary to remove a portion of the polyimide which creates the unsupported terminal. The etching of polyimide is well known in the prior art. For example, Kreuz, U.S. 4,426,253 teaches a chemical etching process for polyimide films in which an aqueous solution of either ethyl or propyl alcohol or mixtures thereof containing a basic compound etch up to 400 times faster than an aqueous solution without alcohol. U.S. Pat. No. 4,426,253 emphasizes the speed at which the etching process occurs with an alcohol containing solution. However in the present invention, it is not the speed of etching which is critical but rather a criteria of etch factor or etch ratio. Etch ratio means the ratio of the degree of etching taking place in a lateral plane relative to the degree of etching taking place perpendicular to the lateral plane, generally expressed in whole numbers, while the etch factor means the etch ratio with the degree of perpendicular etching normalized to 1.

In the present process the minimization of the etch factor is critical to its success. An etch factor not greater than one is preferred and an etch factor not greater than 0.5 is more preferred. In contrast a process employing an etching solution disclosed in Example 2 of Kreuz U.S. Pat. No. 4,426,253 resulted in an etch factor of 9.9 which represents a 30 fold increase in comparison to the optimum results obtained by the present process. A process employing an etching solution of Example 3 in Kreuz U.S. Pat. No. 4,426,253 resulted in an etch factor of 6. The etching step of Kreuz U.S. Pat. No. 4,426,253 is generally not suitable in formation of fine pitch electronic components. Fine pitch means less than 4 mils beam width. In contrast to the disclosure of Kreuz U.S. Pat. No. 4,426,253 which emphasizes speed of etching, the present invention has a requirement that a polyimide substrate which supports the electrically conductive material not be undercut to any significant degree. In other words a criticality in etch factor is present which allows polyimide to be removed in desired areas without removal in adjacent areas.

The present process employs an etching solution consisting essentially of from about 87 to 89% ethanol by weight in an aqueous solution in which a basic compound has been added. Bases which are suitable for use in this invention are potassium hydroxide, sodium hydroxide and cesium hydroxide in concentrations of about 11% to 13% by weight in the solution. The optimum base content is about 12.7% by weight or alternately 2N concentration. A preferred base is potassium hydroxide. Generally the optimum ethanol content will be 88% ethanol by weight for minimization of etching in an X-Y plane.

The technique of applying etching solution is not critical and typical prior art techniques may be employed including use of a spray. The critical requirement is the application of the etching solution to the surface of the polyimide substrate to be removed for maximum etching in a Z plane relative to the X-Y plane.

EXAMPLE 1

This example explains the process of this invention using an etching solution which results in low etch ratios of the polyimide substrate.

The starting article for the etching operation was a Kapton ® polyimide substrate 0.002 inches thick in which; on one side of the substrate was the copper signal layer which had the ultimate signal lines imaged and plated to be 0.0014 in. (0.0036 cm) thick terminating to a centrally intact portion of about 0.340 in × 0.340 in. (0.86 × 0.86 cm) of the copper signal layer and with the copper areas in between the plated lines intact, and on the side opposite the signal layer was a ground plane layer with a 0.400 in. × 0.400 in. (1.0 × 1.0 cm) window previously etched and in registration with the central copper portion on the signal side. Riston ® photoresist covered the entire signal layer.

Etching was performed using a solution by weight of 87.4% ethyl alcohol and 12.6% water in which 12.7 gms of potassium hydroxide were dissolved (2 N potassium hydroxide) at 140 degrees F under 16–20 psi pressure. The etchant was sprayed on to the exposed polyimide by mounting the substrate on a plate fixture, with the exposed polyimide side facing and central to the spray for a time period of 15 minutes. Cross-sections of the part after this step indicated that for every 50 microns of polyimide removed in a z-direction, 17 microns were removed in the in-plane direction producing an etch ratio of about 1:3 (etch factor 0.34).

The photoresist on the signal side of the substrate was then removed and copper areas inbetween the plated signal lines were etched away forming the signal lines, 0.002 in. wide (0.0051 cm), 0.0014 in. thick (0.0036 cm) and with 0.004 in. spacing between signal lines. The central copper portion was also removed in the etching step. The terminus of the beam-type leads to extend, 0.002 in. wide, 0.0014 in. thick, and 0.030 in. long, unsupported into the cavity window. The tin/lead plating was removed, and the part was gold plated. The final result was a 2-conductor part suitable for use in tape automated bonding applications. Subsequent testing indicated no shorting of the part occurred.

COMPARATIVE EXAMPLE

This example illustrates the use of the etching formulation of U.S. Pat. No. 4,426,253 Example 3, to etch a polyimide substrate.

Using the structure detailed in the introductory portion of Example 1, a Kapton ® polyimide substrate was etched using a solution by weight of 80% ethanol and 20% water with 1.8 N potassium hydroxide. The etchant was sprayed at conditions similar to those in Example 1 supra with the steps subsequent to the chemical etching steps being the same as detailed in Example 1.

An etch ratio 6:1 was obtained which was markedly different from that observed in Example 1 (1:3). An etch ratio of 6:1 was unsatisfactory since it is unsuitable for the formation of the fragile beam-type leads, due to their potential for shorting based on the 0.004 in. spacing of the polyimide in undesired areas.

What is claimed is:

1. A process for formation of an electrically conductive lead with an unsupported portion formed by removal through etching of a portion of a polyimide substrate supporting an electrically conductive material comprising the application of an etching solution consisting essentially of about 87 to 89% by weight of ethanol and about 13 to 11% by weight of potassium hydroxide, sodium hydroxide or cesium hydroxide in aqueous solution to the surface of a polyimide substrate other than a substrate surface facing and supporting the electrically conductive material whereby a polyimide layer which supports electrically conductive material is removed.

2. The process of claim 1 wherein the unsupported portions of the electrically conductive lead is a terminal portion.

3. The process of claim 1 wherein the conductive lead is copper.

4. The process of claim 1 wherein the etching solution has an etch factor on the polyimide not greater than than 1.

5. The process of claim 1 wherein the etching solution has an etch factor not greater than 0.5.

6. The process of claim 1 wherein the etching solution is applied to a surface of the polyimide which is parallel to a surface of the polyimide layer which supports the electrically conductive material.

7. The process of claim 1 wherein the etching solution is applied to a surface of the polyimide which lies lateral to a surface of the polyimide layer which supports the electrically conductive material.

8. The process of claim 1 wherein the electrically conductive material comprises copper.

9. The process of claim 1 wherein potassium hydroxide is employed in the etching solution.

10. The process of claim 1 wherein about 87.3% ethanol and about 12.7% potassium hydroxide is employed in the etching solution.

* * * * *